(12) United States Patent
Saxler et al.

(10) Patent No.: US 9,040,398 B2
(45) Date of Patent: *May 26, 2015

(54) METHOD OF FABRICATING SEMINCONDUCTOR DEVICES INCLUDING SELF ALIGNED REFRACTORY CONTACTS

(75) Inventors: Adam William Saxler, Durham, NC (US); Scott Sheppard, Chapel Hill, NC (US)

(73) Assignee: Cree, Inc., Durham, NC (US)

(*) Notice: Subject to any disclaimer, the term of this patent is extended or adjusted under 35 U.S.C. 154(b) by 1148 days.

This patent is subject to a terminal disclaimer.

(21) Appl. No.: 11/434,853

(22) Filed: May 16, 2006

(65) Prior Publication Data

US 2007/0269968 A1    Nov. 22, 2007

(51) Int. Cl.
| H01L 21/265 | (2006.01) |
| H01L 29/778 | (2006.01) |
| H01L 29/66  | (2006.01) |
| H01L 29/20  | (2006.01) |

(52) U.S. Cl.
CPC ......... *H01L 29/7787* (2013.01); *H01L 29/2003* (2013.01); *H01L 29/66462* (2013.01)

(58) Field of Classification Search
CPC ............... H01L 29/7787; H01L 29/66462; H01L 29/2003
USPC ................................ 438/586, 522
See application file for complete search history.

(56) References Cited

U.S. PATENT DOCUMENTS

| 4,522,845 | A | * | 6/1985 | Powell et al. ............... 438/664 |
| 4,586,063 | A | * | 4/1986 | Nakamura et al. ........... 257/280 |
| 4,807,001 | A | * | 2/1989 | Hida ............................. 257/192 |
| 4,946,547 | A |   | 8/1990 | Palmour et al. |
| 4,987,462 | A | * | 1/1991 | Kim et al. ..................... 257/192 |
| 5,021,363 | A | * | 6/1991 | Lockwood et al. ........... 438/571 |
| 5,102,826 | A | * | 4/1992 | Ohshima et al. .............. 438/528 |
| 5,124,762 | A | * | 6/1992 | Childs et al. .................. 257/192 |
| 5,192,987 | A |   | 3/1993 | Khan et al. |
| 5,200,022 | A |   | 4/1993 | Kong et al. |
| 5,210,051 | A |   | 5/1993 | Carter, Jr. |

(Continued)

FOREIGN PATENT DOCUMENTS

| JP | 58012368 A | 1/1983 |
| JP | 61006871 A | 1/1986 |

(Continued)

OTHER PUBLICATIONS

International Search Report and Written Opinion for PCT/US2007/010769; date of mailing Oct. 24, 2007.

(Continued)

*Primary Examiner* — Jarrett Stark
(74) *Attorney, Agent, or Firm* — Myers Bigel Sibley & Sajovec

(57) ABSTRACT

Methods of forming semiconductor devices are provided by forming a semiconductor layer on a semiconductor substrate. A mask is formed on the semiconductor layer. Ions having a first conductivity type are implanted into the semiconductor layer according to the mask to form implanted regions on the semiconductor layer. Metal layers are formed on the implanted regions according to the mask. The implanted regions and the metal layers are annealed in a single step to respectively activate the implanted ions in the implanted regions and provide ohmic contacts on the implanted regions. Related devices are also provided.

33 Claims, 3 Drawing Sheets

(56) References Cited

U.S. PATENT DOCUMENTS

| | | | |
|---|---|---|---|
| 5,268,323 A * | 12/1993 | Fischer et al. | 438/200 |
| 5,292,501 A | 3/1994 | Degenhardt et al. | |
| 5,296,394 A * | 3/1994 | Shim et al. | 438/81 |
| 5,296,395 A | 3/1994 | Khan et al. | |
| RE34,861 E | 2/1995 | Davis et al. | |
| 5,393,993 A | 2/1995 | Edmond et al. | |
| 5,523,589 A | 6/1996 | Edmond et al. | |
| 5,650,642 A * | 7/1997 | Sawada et al. | 257/192 |
| 5,986,291 A * | 11/1999 | Currie et al. | 257/194 |
| 6,218,680 B1 | 4/2001 | Carter, Jr. et al. | |
| 6,316,793 B1 | 11/2001 | Sheppard et al. | |
| 6,329,677 B1 * | 12/2001 | Oguri et al. | 257/194 |
| 6,335,249 B1 * | 1/2002 | Thei et al. | 438/296 |
| 6,498,111 B1 | 12/2002 | Kapolnek et al. | |
| 6,548,333 B2 | 4/2003 | Smith | |
| 6,686,616 B1 | 2/2004 | Allen et al. | |
| 6,787,821 B2 * | 9/2004 | Minetani | 257/194 |
| 6,849,882 B2 | 2/2005 | Smorchkova et al. | |
| 6,974,969 B2 | 12/2005 | Taylor | |
| 6,982,204 B2 | 1/2006 | Saxler et al. | |
| 7,030,428 B2 | 4/2006 | Saxler | |
| 7,045,404 B2 * | 5/2006 | Sheppard et al. | 438/191 |
| 7,067,361 B2 * | 6/2006 | Allen et al. | 438/167 |
| 7,084,441 B2 | 8/2006 | Saxler | |
| 7,115,431 B2 * | 10/2006 | Chen | 438/30 |
| 7,138,310 B2 * | 11/2006 | Currie et al. | 438/199 |
| 7,187,045 B2 | 3/2007 | Braddock | |
| 7,265,399 B2 | 9/2007 | Sriram et al. | |
| 2004/0135161 A1 | 7/2004 | Taylor | |
| 2005/0170574 A1 * | 8/2005 | Sheppard et al. | 438/172 |
| 2005/0258451 A1 | 11/2005 | Saxler et al. | |
| 2005/0269573 A1 * | 12/2005 | Seng et al. | 257/77 |
| 2006/0244045 A1 * | 11/2006 | Visokay et al. | 257/315 |
| 2007/0158683 A1 * | 7/2007 | Sheppard et al. | 257/183 |
| 2007/0164322 A1 * | 7/2007 | Smith et al. | 257/256 |
| 2008/0121895 A1 * | 5/2008 | Sheppard et al. | 257/76 |

FOREIGN PATENT DOCUMENTS

| | | |
|---|---|---|
| JP | 61222263 A | 10/1986 |
| JP | 2000340581 A | 12/2000 |
| JP | 2005116858 A | 4/2005 |
| WO | WO 2005/119787 A | 12/2005 |
| WO | WO 2005/119787 A1 | 12/2005 |

OTHER PUBLICATIONS

Burm et al. "Ultra-low resistive ohmic contacts on $n$-GaN using Si implantation" *Appl. Phys. Lett.* 70(4):464-466 (1997).

Lester et al. "Nonalloyed Ti/Al Ohmic contacts to n-type GaN using high-temperature premetallization anneal" *Appl. Phys. Lett.* 69(18):2737-2739 (1996).

Yoshida et al. "High-Temperature Reliability of gaN Electronic Devices".

Yu et al. "Schottky barrier engineering in III-V nitrides via the piezo-electric effect" *Applied Physics Letters* 73(13) (1998).

U.S. Appl. No. 60/337,687, filed Dec. 3, 2001, Saxler.

U.S. Appl. No. 11/286,805, filed Nov. 23, 2005, Saxler.

U.S. Appl. No. 11/434,854, filed May 16, 2006, Suvorov.

Examination Report, European Patent Application No. 07776709.3, Mar. 3, 2011, 5 pages.

Office Action, Japanese Patent Application No. 2009-510966, Jan. 7, 2014.

Office Action, Japanese Patent Application No. 2009-510966, Mar. 8, 2013, 4 pages.

Office Action, Canadian Patent Application No. 2,651,670, Dec. 10, 2013.

Office Action, Taiwan Patent Application No. 096117233, Jan. 23, 2013, 6 pages.

* cited by examiner

METHOD OF FABRICATING SEMICONDUCTOR DEVICES INCLUDING SELF ALIGNED REFRACTORY CONTACTS

FIELD OF THE INVENTION

The present invention relates to semiconductor devices and related methods of fabricating semiconductor devices and, more particularly, to semiconductor devices including refractory metal contacts and related methods of fabrication.

BACKGROUND

There is a high level of interest in wide bandgap semiconductor materials such as silicon carbide (SiC) (2.996 eV for alpha SiC at room temperature) and the Group III nitrides, such as 3.36 eV for GaN at room temperature, for high power, high temperature and/or high frequency applications. These materials, typically, have higher electric field breakdown strengths and higher electron saturation velocities relative to gallium arsenide (Gas) and silicon (Si).

A device of particular interest for high power and/or high frequency applications is the High Electron Mobility Transistor (HEMT), which is also known as a modulation doped field effect transistor (MODFET). These devices may offer operational advantages under a number of circumstances because a two-dimensional electron gas (2DEG) is formed at the heterojunction of two semiconductor materials with different bandgap energies, and where the smaller bandgap material has a higher electron affinity. The 2DEG is an accumulation layer in the undoped ("unintentionally doped"), smaller bandgap material and can contain a very high sheet electron concentration in excess of, for example, $10^{13}$ carriers/$cm^2$. Additionally, electrons that originate in the wider-bandgap semiconductor transfer to the 2DEG, allowing a high electron mobility due to reduced ionized impurity scattering.

This combination of high carrier concentration and high carrier mobility can give the HEMT a very large transconductance and may provide a strong performance advantage over metal-semiconductor field effect transistors (MESFETs) for high-frequency applications.

High electron mobility transistors fabricated in the gallium nitride/aluminum gallium nitride (GaN/AlGaN) material system have the potential to generate large amounts of RF power because of the combination of material characteristics that includes the aforementioned high breakdown fields, their wide bandgaps, large conduction band offset, and/or high saturated electron drift velocity. In addition, a major portion of the electrons in the 2DEG is attributed to polarization in the AlGaN.

HEMTs in the GaN/AlGaN system have already been demonstrated. For example, U.S. Pat. Nos. 5,192,987 and 5,296,395 discuss AlGaN/GaN HEMT structures and related methods of manufacture. Furthermore, U.S. Pat. No. 6,316,793, to Sheppard et al., which is currently commonly assigned to the assignee of the present application and the disclosure of which is incorporated herein by reference as if set forth in its entirety, discussed HEMT devices having a semi-insulating silicon carbide substrate, an aluminum nitride buffer layer on the substrate, an insulating gallium nitride layer on the buffer layer, an aluminum gallium nitride barrier layer on the gallium nitride layer, and a passivation layer on the aluminum gallium nitride active structure.

In order to provide desired semiconductor properties, it may be desirable to dope a semiconductor layer with impurity atoms, i.e. dopants. Doping of semiconductor materials may be performed during and/or after material growth. Impurity atoms may be categorized as n-type or p-type depending on whether the implanted ions act as donors (which increase the number of electrons) or acceptors (which increase the number of holes), respectively, in the doped material. The resulting material may be characterized as n-type or p-type depending on the predominant type of dopants in the material.

Ion implantation is a well-known method of doping a semiconductor layer with impurities. In an ion implantation process, ionized impurity atoms are accelerated under high vacuum through an electric field towards a target layer, where they become implanted. The number of ions directed at a target layer is referred to as the dose, which is typically expressed in ions/$cm^2$. The ions are accelerated at an energy level, typically expressed in electron-volts (eV). The distribution of ions in the implanted layer depends on the dose and energy of the implant, sometimes referred to as the implant conditions, as well as the type of ions implanted, the type of material the ions are implanted into, the angle of the implants, and other factors. The implanted ions typically form a concentration distribution that has a peak concentration at a particular depth, i.e., the "implant range".

Ion implantation is useful for selective doping of crystalline material in order to form desired regions in the material, such as p-n junctions, highly conductive contact regions, field spreading regions, and the like. Typically, after impurities are implanted into a semiconductor layer, the implanted impurities may be annealed at a high temperature, this may be called an activation anneal. An activation anneal may repair damage caused by the implantation of high-energy ions into the semiconductor lattice. Implant damage may include, for example, broken and/or rearranged chemical bonds within the semiconductor lattice. The activation anneal may also assist implanted impurity ions in finding a suitable site in the crystal lattice at which the ions may appropriately act as acceptors and/or donors.

For some semiconductor materials, the temperature at which appreciable lattice damage repair may occur is above the temperature at which the material will dissociate at normal ambient pressures. For that reason, it is known to provide a stable capping layer on an implanted semiconductor layer during the activation anneal. The material of the capping layer may be stable at high temperatures. Removal of such a capping layer may be problematic after the implanted layer is annealed.

SUMMARY OF THE INVENTION

Some embodiments of the present invention provide methods of forming a semiconductor device, the method including forming a semiconductor layer on a semiconductor substrate. A mask is formed on the semiconductor layer. Ions having a first conductivity type are implanted into the semiconductor layer according to the mask to form implanted regions on the semiconductor layer. Metal layers are formed on the implanted regions according to the mask. The implanted regions and the metal layers are annealed in a single step to respectively activate the implanted ions in the implanted regions and provide ohmic contacts on the implanted regions.

In further embodiments of the present invention, forming the semiconductor layer may include forming a channel layer on the semiconductor substrate, forming a barrier layer on the channel layer and forming a protective layer on the barrier layer. Furthermore, the mask may be formed on the protective layer.

In still further embodiments of the present invention, the protective layer may be etched according to the mask to expose at least a portion of a surface of the barrier layer. The ions may be implanted into the barrier layer according to the mask to form implanted regions on the barrier layer. The implanted regions extend at least partially into the channel layer.

In some embodiments of the present invention, ions may be implanted into the protective layer and the barrier layer according to the mask to form implanted regions in the protective layer and the barrier layer. The protective layer may be etched according to the mask to expose at least a portion of the implanted regions of the barrier layer. The implanted regions may extend at least partially into the channel layer.

In further embodiments of the present invention, the ohmic contacts may include at least one refractory metal. The refractory metal may include Ti, TiW, Mo, Ta, W, WSi, Re, Nb, TiWN, NiSi and/or TiSi. The ohmic contacts may be self-aligned to the implanted regions.

In still further embodiments of the present invention, the first conductivity type may be an n-type conductivity. The implanted ions may be silicon ions. The implanted regions and the metal layer may be annealed at a temperature of at least about 950° C. The semiconductor device may be a Group III-nitride semiconductor device.

In some embodiments of the present invention, 7. The protective layer may be a high purity nitrogen (HPN) layer. The HPN layer has a thickness of from about 50 to about 150 nm. In certain embodiments of the present invention, the HPN layer may be an HPN having a thickness of from about 50 to about 150 nm and a silicon dioxide ($SiO_2$) layer on the HPN layer having a thickness of from about 100 to about 250 nm.

Although embodiments of the present invention are discussed above with respect to method embodiments, device embodiments are also provided herein.

DETAILED DESCRIPTION OF EMBODIMENTS OF THE INVENTION

Figure 1A:
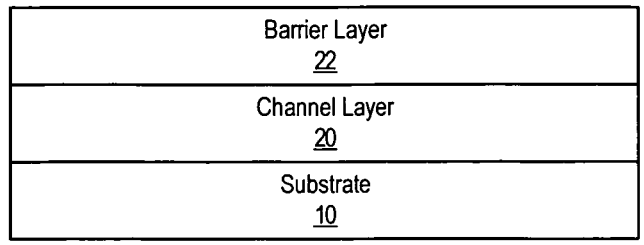
FIGS. 1A-1F are cross-sectional views illustrating fabrication of a transistor according to embodiments of the present invention.

Embodiments of the present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Furthermore, the various layers and regions illustrated in the figures are illustrated schematically. Accordingly, the present invention is not limited to the relative size, spacing and alignment illustrated in the accompanying figures. As will also be appreciated by those of skill in the art, references herein to a layer formed "on" a substrate or other layer may refer to the layer formed directly on the substrate or other layer or on an intervening layer or layers formed on the substrate or other layer. It will also be appreciated by those of skill in the art that references to a structure or feature that is disposed "adjacent" another feature may have portions that overlap or underlie the adjacent feature.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the present invention may be particularly well suited for use in nitride-based HEMTs such as Group III-nitride based devices. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$ where $0 \leq x \leq 1$ are often used to describe them.

Suitable structures for GaN-based HEMTs that may utilize embodiments of the present invention are described, for example, in currently commonly assigned U.S. Pat. No. 6,316,793 and U.S. Patent Publication No. 2002/0066908A1 filed Jul. 12, 2001 and published Jun. 6, 2002, for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," U.S. provisional application Ser. No. 60/290,195 filed May 11, 2001 for "GROUP III NITRIDE BASED HIGH ELECTRON MOBILITY TRANSISTOR (HEMT) WITH BARRIER/SPACER LAYER," United States Patent Publication No. 2002/0167023A1 to Smorchkova et al., published Nov. 14, 2002, entitled "GROUP-III NITRIDE BASED HIGH ELECTRON MOBILITY TRANSISTOR (HEMT) WITH BARRIER/SPACER LAYER" and U.S. patent application Ser. No. 10/617,843 filed Jul. 11, 2003 for "NITRIDE-BASED TRANSISTORS AND METHODS OF FABRICATION THEREOF USING NON-ETCHED CONTACT RECESSES," the disclosures of which are hereby incorporated herein by reference in their entirety.

However, while embodiments of the present invention are described in connection with GaN HEMT devices, the present invention may be employed in connection with other types of devices and/or materials. For example, embodiments of the invention may also be particularly suited for use in silicon carbide MESFET devices, such as the devices described in U.S. Pat. No. 6,686,616 entitled "SILICON CARBIDE METAL-SEMICONDUCTOR FIELD EFFECT TRANSISTORS" the disclosure of which is hereby incorporated herein by reference in their entirety. Likewise, some embodiments of the invention may be advantageously employed in GaN-based light emitting devices (LEDs), as well as in GaAs-based devices such as GaAs/AlGaAs pHEMT devices.

Embodiments of the present invention will now be discussed below with respect to FIGS. 1A through 1F. As discussed herein, some embodiments of the present invention provide semiconductor devices and methods of forming semiconductor devices having refractory metal contacts that are self-aligned to implanted regions on which the refractory metal contacts are provided. Methods according to some embodiments of the present invention provide for a simultaneous anneal of the implanted regions and the refractory metal contacts, which may simplify the fabrication process of semiconductor devices. Furthermore, provision of refractory metal contacts on highly doped implanted regions according to some embodiments of the present invention may provide improved contact resistivity as will be discussed further herein.

As used herein, "self-aligned" refers to methods and devices where the implanted regions and ohmic metals are both defined by one photolithography step as will be discussed further herein. Accordingly, according to some embodiments of the present invention, subsequent photolithography steps and likelihood of concomitant misalignment may be avoided.

Fabrication of structures according to embodiments of the present invention is schematically illustrated in FIGS. 1A through 1F. As seen in FIG. 1A, a substrate 10 is provided on which nitride based devices may be formed. In particular embodiments of the present invention, the substrate 10 may be a semi-insulating silicon carbide (SiC) substrate that may be, for example, 4H polytype of silicon carbide. Other silicon carbide candidate polytypes include the 3C, 6H, and 15R polytypes. The term "semi-insulating" is used in a relative rather than absolute sense. In particular embodiments of the present invention, the silicon carbide bulk crystal has a resistivity equal to or higher than about $1 \times 10^5$ Ω-cm at room temperature.

Optional buffer, nucleation and/or transition layers (not shown) may be provided on the substrate 10. For example, an AlN buffer layer may be provided to provide an appropriate crystal structure transition between the silicon carbide substrate and the remainder of the device. Additionally, strain balancing transition layer(s) may also be provided as described, for example, in currently commonly assigned United States Patent Publication 2003/0102482A1 entitled "STRAIN BALANCED NITRIDE HETROJUNCTION TRANSISTORS AND METHODS OF FABRICATING STRAIN BALANCED NITRIDE HETEROJUNCTION TRANSISTORS, and U.S. Provisional Patent Application Ser. No. 60/337,687, filed Dec. 3, 2001 and entitled "STRAIN BALANCED NITRIDE HETEROJUNCTION TRANSISTOR," the disclosures of which are incorporated herein by reference as if set forth fully herein.

Silicon carbide has a much closer crystal lattice match to Group III nitrides than does sapphire ($Al_2O_3$), which is a very common substrate material for Group III nitride devices. The closer lattice match may result in Group III nitride films of higher quality than those generally available on sapphire. Silicon carbide also has a very high thermal conductivity so that the total output power of Group III nitride devices on silicon carbide is, typically, not as limited by thermal dissipation of the substrate as in the case of the same devices formed on sapphire. Also, the availability of semi-insulating silicon carbide substrates may provide for device isolation and reduced parasitic capacitance. Appropriate SiC substrates are manufactured by, for example, Cree, Inc., of Durham, N.C., the current assignee of the present invention, and methods for producing are described, for example, in U.S. Pat. Nos. Re. 34,861; 4,946,547; 5,200,022; and 6,218,680, the disclosures of which are incorporated herein by reference in their entirety. Similarly, techniques for epitaxial growth of Group III nitrides have been described in, for example, U.S. Pat. Nos. 5,210,051; 5,393,993; 5,523,589; and 5,292,501, the disclosures of which are also incorporated herein by reference in their entireties.

Although silicon carbide may be used as a substrate material, embodiments of the present invention may utilize any suitable substrate, such as sapphire, aluminum nitride, aluminum gallium nitride, gallium nitride, silicon, GaAs, LGO, ZnO, LAO, InP and the like. In some embodiments, an appropriate buffer layer also may be formed.

Referring again to FIG. 1A, a channel layer 20 is provided on the substrate 10. The channel layer 20 may be deposited on the substrate 10 using buffer layers, transition layers, and/or nucleation layers as described above. The channel layer 20 may be under compressive strain. Furthermore, the channel layer and/or buffer nucleation and/or transition layers may be deposited using, for example, MOCVD or other techniques known to those of skill in the art, such as MBE or HVPE.

In some embodiments of the present invention, the channel layer 20 is a Group III-nitride, such as $Al_xGa_{1-x}N$ where $0 \le x \le 1$, provided that the energy of the conduction band edge of the channel layer 20 is less than the energy of the conduction band edge of the barrier layer 22 at the interface between the channel and barrier layers. In certain embodiments of the present invention, x=0, indicating that the channel layer 20 is GaN. The channel layer 20 may also be other Group III-nitrides such as InGaN, AlInGaN or the like. The channel layer 20 may be undoped ("unintentionally doped") and may be grown to a thickness of greater than about 20 Å. The channel layer 20 may also be a multi-layer structure, such as a superlattice or combinations of GaN, AlGaN or the like.

A barrier layer 22 is provided on the channel layer 20. The channel layer 20 may have a bandgap that is less than the bandgap of the barrier layer 22 and the channel layer 20 may also have a larger electron affinity than the barrier layer 22.

The barrier layer 22 may be deposited on the channel layer 20. In certain embodiments of the present invention, the barrier layer 22 is AlN, AlInN, AlGaN or AlInGaN with a thickness of between about 0.1 nm and about 10 nm. Examples of layers according to certain embodiments of the present invention are described in United States Patent Publication No. 2002/0167023A1, to Smorchkova et al., entitled "GROUP-III NITRIDE BASED HIGH ELECTRON MOBILITY TRANSISTOR (HEMT) WITH BARRIER/SPACER LAYER" the disclosure of which is incorporated herein by reference as if set forth fully herein. In particular embodiments of the present invention, the barrier layer 22 is thick enough and has a high enough Al composition and doping to induce a significant carrier concentration at the interface between the channel layer 20 and the barrier layer 22 through polarization effects when the barrier layer 22 is buried under ohmic contact metal. Also, the barrier layer 22 should be thick enough to reduce or minimize scattering of electrons in the channel due to ionized impurities deposited at the interface between the barrier layer 22 and a protective 24 (FIG. 1B).

As noted above, the barrier layer 22 may have a bandgap larger than that of the channel layer 20 and a smaller electron affinity than the channel layer 20. Accordingly, in certain embodiments of the present invention, the barrier layer 22 may include AlGaN, AlInGaN and/or AlN or combinations of layers thereof. The barrier layer 22 may, for example, be from about 0.1 nm to about 200 nm thick, but should not be so thick as to cause cracking or substantial defect formation therein. In certain embodiments of the present invention, the barrier layer 22 is undoped or doped with an n-type dopant to a concentration less than about $1 \times 10^{19}$ cm$^{-3}$. In some embodiments of the present invention, the barrier layer 22 is $Al_xGa_{1-x}N$ where $0<x<1$. In particular embodiments, the aluminum concentration is about 25%. However, in other embodiments of the present invention, the barrier layer 22 comprises AlGaN with an aluminum concentration of between about 5% and about 100%. In specific embodiments of the present invention, the aluminum concentration is greater than about 10%.

Figure 1B:
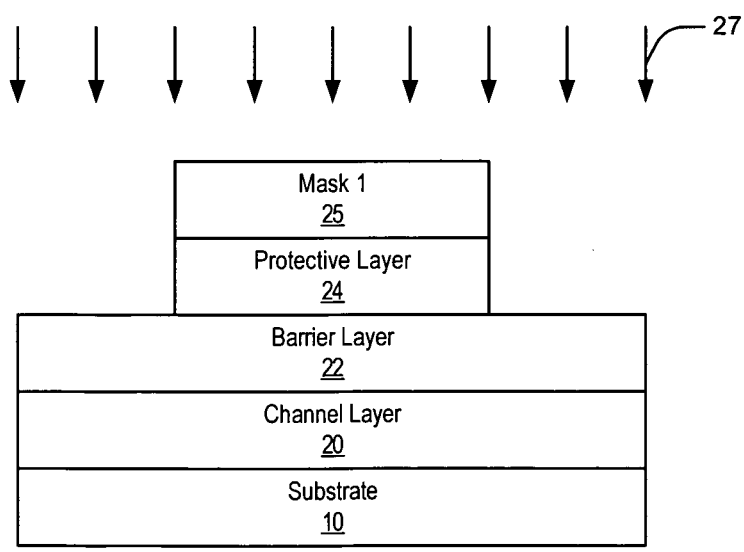

As shown in FIG. 1B, a protective layer 24 is formed on the barrier layer 22. The protective layer 24 may be silicon nitride ($Si_xN_y$), silicon dioxide ($SiO_2$) and/or another suitable protective material, such as silicon oxynitride (SiON). It will be understood that the terms "$Si_xN_y$," "SiN" and "silicon nitride" are used herein interchangeably to refer to both stoichiometric and non-stoichiometric silicon nitride. Other materials may also be utilized for the protective layer 24. For example, the protective layer 24 could also include magnesium oxide, scandium oxide, aluminum oxide and/or aluminum oxynitride. Furthermore, the protective layer 24 may be a single layer or multiple layers of uniform and/or non-uniform composition. The material of the protective layer 24 should have appropriate interface characteristics, should be capable of withstanding relatively high temperatures, and should be capable of being removed without significantly damaging the underlying barrier layer 22.

In general, the protective layer 24 may be a dielectric layer that has a relatively high breakdown field strength and that provides a relatively low interface trap density at the interface with an underlying Group III-nitride layer such as the barrier layer 22. The protective layer 24 may have a high etch selectivity with respect to the material of the barrier layer 22, and may not be reactive to the material of the barrier layer 22. Moreover, the protective layer 24 may have a relatively low level of impurities therein. For example, the protective layer 24 may have a relatively low level of hydrogen and other impurities, including oxygen, carbon, fluorine and chlorine.

In addition, the protective layer 24 may be stable at relatively high temperatures (e.g. >1000° C.) in order to withstand high annealing temperatures used in subsequent process steps.

In particular embodiments of the present invention, the protective layer 24 is SiN. The SiN may be formed for example, by Low Pressure Chemical Vapor Deposition (LPCVD) and/or Metal-Organic Chemical Vapor Deposition (MOCVD). The SiN layer may be stoichiometric (i.e. the ratio of silicon to nitrogen in the material is about 3:4). The stoichiometry of a SiN layer may be adjusted, for example, by adjusting the relative flow rates of $SiH_4$ and $NH_3$ source gases in a CVD process. Moreover, when formed at relatively high temperatures, CVD-grown SiN tends to be stoichiometric.

The stoichiometry of a SiN layer may also affect the index of refraction of the layer. In certain embodiments of the present invention, a SiN protective layer 24 may have an index of refraction at a 633 nm wavelength of from about 1.6 to about 2.2. In particular embodiments, the index of refraction of a SiN protective layer 24 is 1.98±0.05 as measured by ellipsometry. Stoichiometric SiN may also be characterized by its etch rate in a buffered oxide etch (BOE). For example, the etch rate of stoichiometric SiN in BOE is nearly zero.

In some embodiments, the protective layer 24 may be $SiO_2$. The $SiO_2$ may be formed by LPCVD and/or MOCVD and may be stoichiometric. In certain embodiments of the present invention, an $SiO_2$ protective layer may have an index of refraction at a 633 nm wavelength of from about 1.36 to about 1.56. In particular embodiments, the index of refraction of an $SiO_2$ protective layer is 1.46±0.03 as measured by ellipsometry.

When the protective layer 24 includes silicon nitride, the protective layer 24 should have impurity levels at or below the levels shown in Table 1, as measured by secondary ion mass spectroscopy (SIMS) with a Cs ion beam.

TABLE 1

| Element | Concentration (cm$^{-3}$) |
|---------|---------------------------|
| H       | $4 \times 10^{21}$        |
| O       | $3 \times 10^{18}$        |
| C       | $1 \times 10^{18}$        |
| F       | $1 \times 10^{17}$        |
| Cl      | $1 \times 10^{17}$        |

The protective layer 24 may be blanket formed on the barrier layer 22. Typically, the protective layer 24 may have a thickness in the range of about 100 nm, however, other thickness layers may also be utilized. For example, the protective layer should be sufficiently thick so as to protect the underlying layer during a subsequent anneal of ohmic contacts. Layers as thin as two or three monolayers may be sufficient for such purposes. However, in general, the protective layer 24 may have a thickness of from about 10 nm to about 500 nm.

The protective layer may comprise a high purity SiN layer as described in U.S. patent application Ser. No. 11/286,805 filed on Nov. 23, 2005 entitled "GROUP III NITRIDE SEMICONDUCTOR DEVICES WITH SILICON NITRIDE LAYERS AND METHODS OF MANUFACTURING SUCH DEVICES," the disclosure of which is incorporated herein by reference as if fully set forth herein. In particular, pursuant to certain embodiments of the present invention, an in situ grown SiN protective layer 24 may be grown at relatively high temperatures (e.g., above about 700° C.). In particular embodiments, the SiN layers may be grown at a temperature in the range of about 900-1000° C. Such high temperature growth may also facilitate reducing the impurity levels in the SiN layer and at the interface between a Group III nitride layer and the SiN layer. Additionally, high growth rates may be employed which may facilitate reducing the levels of background reactor impurities incorporated into the SiN layer. For example, in certain embodiments of the present invention, the SiN layer(s) may be grown at a growth rate of at least about 0.2 microns/hour. In certain specific embodiments, the growth rate may be about 2 microns/hour.

Forming the SiN layer in situ may also reduce the levels of impurities that are incorporated into the top surface of the uppermost Group III nitride layer and/or into the SiN layer itself. In particular, when the device is removed from the reactor and the SiN layer is formed via a post-MOCVD growth process such as, for example, sputtering or PECVD, a number of different mechanisms may introduce impurities. For example, as discussed in detail in U.S. Pat. No. 6,498,111, if hydrogen is present in an MOCVD reactor during the growth of a Group III nitride layer, the hydrogen may tend to incorporate into the Group III nitride layer during cooling of the reactor following growth. Likewise, exposure of the device to the atmosphere upon removal from the reactor may allow for incorporation of oxygen atoms, and various other impurities may be introduced, particularly adjacent the outer surfaces of the device, as a result of handling of the device and/or chemical cleaning of the device. Impurities may also be added if post-growth processing such as wet etching, electrode deposition, annealing steps, etc. are performed prior to deposition of the SiN protective/passivation layer. These impurities may change the surface states at the interface between the Group III nitride layer and the SiN layer in ways that may be undesirable and/or difficult to control/reproduce. For example, the presence of impurities can increase trapping at the interface between the SiN layer and the underlying Group III nitride layer, thereby increasing the sheet resistance of the channel.

In certain embodiments of the present invention, high purity silane ($SiH_4$) may be used as a source gas in the growth of the SiN layer(s). As is known to persons of skill in the art, silane is often used as a source for silicon dopants in the growth of n-doped Group III nitride layers. Typically, diluted silane gas is used in such applications as it is less expensive and easier to use than pure silane, which may be highly combustible. The use of such pure silane may facilitate reducing the level of impurities at, for example, the interface between the Group III nitride layer and the SiN layer and/or within the SiN layer, which may, in certain circumstances, improve the performance and/or reproducibility of the device. In particular, the higher quality (i.e., more pure) SiN layer may help reduce or minimize trapping within the body of the insulative layer, thereby providing a higher breakdown critical field. When such a pure silane gas source is included with the reactor, it may still be desirable to include a diluted silane source as well, so that diluted silane gas may be used as the dopant gas source during the growth of, for example, an n-doped or co-doped Group III nitride layer.

Referring still to FIG. 1B, a mask 25 is formed on the protective layer 24. The mask 25 may include photoresist or any other suitable mask material such as SiN and/or $SiO_2$. The mask may have a thickness selected to block implanted ions. For example, when the protective layer comprises SiN, the mask 25 may include an oxide such as $SiO_2$, and vice-versa. The mask 25 (photoresist) may be patterned for ohmic areas as illustrated in FIG. 1B. Windows may be opened in the protective layer 24 for the formation of ohmic contacts. In particular, the protective layer 24 may be etched according to the mask 25 until a surface of the barrier layer 22 is exposed. The windows may be formed utilizing a low damage etch with respect to the barrier layer 22 to expose the underlying barrier layer 22. Examples of low damage etch techniques include etching techniques other than reactive ion etching, such as inductively coupled plasma or electron cyclotron resonance (ECR) or downstream plasma etching with no DC component to the plasma. For an $SiO_2$ protective layer 24, a low damage etch could be a wet etch with buffered hydrofluoric acid. A selective etch of SiN and/or $SiO_2$ to an etch stop layer, followed by a low damage removal of the etch stop layer could also be performed. For SiN, $SiO_2$ may be used as an etch stop layer. In such embodiments, the protective layer 24 may include the SiN and/or $SiO_2$ layer as well as the etch stop layer. Thus, in certain embodiments of the present invention, the protective layer 24 may include multiple layers.

Figure 1C:
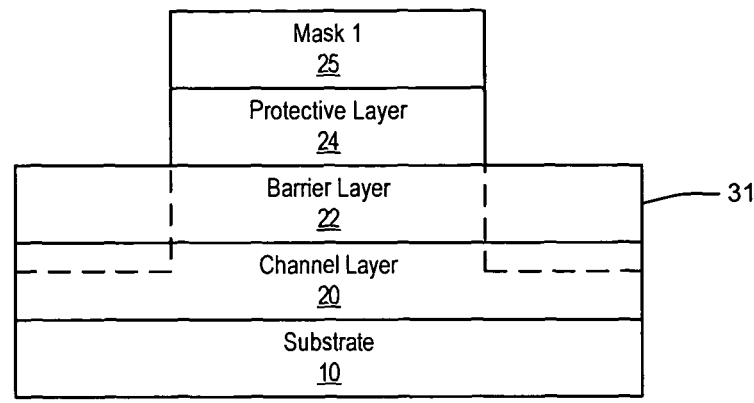

As further illustrated in FIG. 1B, impurity ions 27 are implanted through the windows into the barrier layer 22. For example, n-type impurity ions, such as Si, may be implanted into the barrier layer 22. In some embodiments of the present invention, some of the implanted ions may come to rest within the channel layer 20. Accordingly, as shown in FIG. 1C, an implanted region 31 may be formed within the barrier layer 22 and/or the channel layer 20.

It will be understood that in some embodiments of the present invention, the impurity ions 27 may be implanted before the protective layer 24 is etched to expose the barrier layer 22. In these embodiments, the implanted region 31 may be formed partially within the protective layer 24, the barrier layer 22 and/or the channel layer 20. Then, the protective layer 24 including the implanted ions may be removed to expose the implanted region of the barrier layer 22.

The implant conditions may be selected to provide an implanted region 31 having a peak dopant concentration of $1\times10^{18}$ $cm^{-3}$ or greater. For example, in some embodiments, the dose and energy of the implants may be selected to provide a peak dopant concentration of about $5\times10^{19}$ $cm^{-3}$. The implant process may include multiple implant steps to provide a net profile of implanted dopants. For example, the implant process may include a first implant step performed under a first set of implant conditions and a subsequent implant step performed under a second set of implant conditions. More than two implant steps may be performed.

In some embodiments, the implants may be performed at room temperature. The implant energies and dose may be selected to provide an implant profile that achieves a desired sheet resistivity and/or permits fabrication of low resistivity ohmic contacts to the barrier layer 22 as provided below. In order to form n-type implanted regions 31 in a nitride-based layer, the implanted ions may include silicon, sulfur, germanium and/or oxygen ions.

Some embodiments of the present invention may use implantation methods discussed in currently commonly assigned U.S. patent application Ser. No. 11/434,854 entitled METHODS AND APPARATUS FOR FABRICATING SEMICONDUCTOR DEVICES HAVING REDUCED IMPLANT CONTAMINATION AND RELATED DEVICES, filed concurrently herewith, the disclosure of which is hereby incorporated herein by reference as if set forth in its entirety.

Figure 1D:
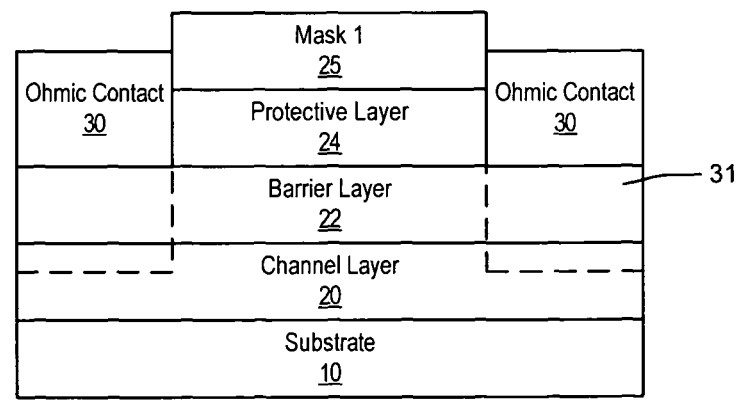

As illustrated in FIG. 1D, metal may be deposited in the windows, for example, by evaporation, on the implanted regions 31 to provide the ohmic contacts 30. Suitable metals may include refractory metals, such as titanium (Ti), tungsten (W), titanium tungsten (TiW), Si, TiWN, tungsten silicide (WSi), rhenium (Re), Niobium (Nb), nickel (Ni), gold (Au), aluminum (Al), tantalum (Ta), molybdenum (so), nickel silicide (NiSi), titanium silicide (TiSi), titanium nitride (TiN), tungsten silicon nitride (WSiN), platinum (Pt) and the like. Any unwanted metal may be removed using, for example, a solvent. Thus, according to some embodiments of the present invention, the ohmic contacts 30 are self-aligned to the implanted regions 31 as illustrated in FIG. 1D.

The implant regions 31 and the contacts 30 may be annealed in a single step. In particular, the contacts 30 may be annealed at a temperature of at least about 950° C., which may also activate the implanted dopants in the implant regions 31. The anneal may be performed in an atmosphere of an inert gas such as N2 or Ar. Furthermore, the anneal may be performed in an atmosphere of NH3, for example, in embodiments of the present invention where the protective layer 24 is SiN and the contacts 30 are a metal nitride such as TiWN, WSiN, or TiN. Through the use of an ohmic contact anneal, the resistance of the ohmic contacts may be reduced from a relatively high resistance to about 1 Ω-mm or less. Thus, as used herein, the term "ohmic contact" refers to a non-rectifying contact that has a contact resistance of about 1 Ω-mm or less. The presence of the protective layer 24 during the high temperature process steps may inhibit damage to the barrier layer 22 that may otherwise be caused by such steps. Thus, for example, the sheet resistance of the gate region after the high temperature ohmic contact/implant anneal may be substantially the same as the sheet resistance of the gate region as-grown, i.e., before the contact anneal.

In some embodiments of the present invention, the mask 25 may be removed prior to the anneal, for example, by means of a photoresist strip and/or an etch process. However, the activation anneal may be performed with the protective layer 24 in place. In particular, the protective layer 24 may protect the surface of the barrier layer 22 during the anneal.

In some embodiments of the present invention, the activation anneal may be performed in an inert atmosphere including, for example, $N_2$ and/or Ar. In some embodiments, $SiH_4$ may be provided during the implant anneal along with $NH_3$, in which case, SiN may be deposited on the protective layer during the anneal. The activation anneal may be performed in-situ and/or in a separate annealing chamber. The activation anneal may be performed for at least about 30 seconds or more, depending on the anneal temperature. For example, a rapid thermal anneal (RTA) at about 1300° C. may be performed for about 30 seconds, while a furnace anneal at about 1000° C. may be performed for about 30 minutes. The particular selection of activation times and temperatures may vary depending on the type of materials involved and the particular implant conditions employed. In particular embodiments, the anneal time may be in the range of about 30 seconds to about 30 minutes.

It will be understood that since the ohmic contacts 30 are formed on the implanted regions 31, the ohmic contacts may have a lower resistivity than ohmic contacts formed on non-implanted regions. Thus, the on-resistance of devices formed according to some embodiments of the invention may be lowered.

It will be further understood that in some embodiments of the present invention, the ohmic contacts 30 may be capped with other metals, for example, Au after the anneal.

The formation of improved ohmic contacts in GaN HEMTs may help improve the performance of power amplifiers at mm-wave frequencies, as well as other applications that require low on-resistance, including, for example, RF power switches, limiters, and cascode cells. For typical transistor applications, reducing the contact resistance of the device may permit an increase in the drain-source spacing without increasing the on-resistance of the device.

Figure 1E:
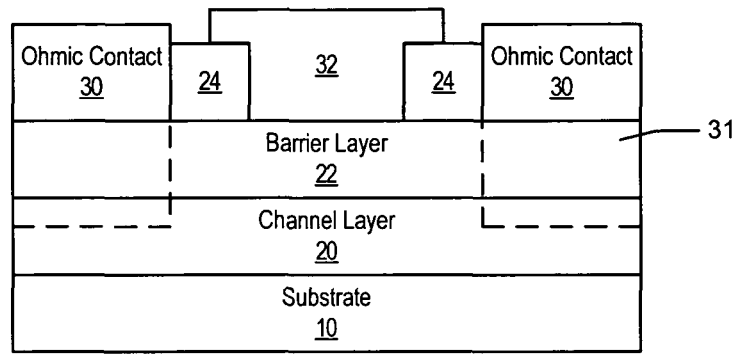

Referring now to FIG. 1E, the mask 25 may be removed. FIG. 1E further illustrates the formation of a gate contact 32. A mask (not shown) is formed on the ohmic contacts and the protective layer 24 and patterned to form a window that exposes a portion of the protective layer 24. A recess is then formed through the protective layer 24 to expose a portion of the barrier layer 22. The recess is formed using a low damage etch process as described above. In particular embodiments where the ohmic contacts 30 provide source and drain contacts, the recess may be offset between the source and drain contacts such that the recess, and subsequently the gate contact 32, is closer to the source contact than the drain contact.

In some embodiments of the present invention, the protective layer may include a high purity nitrogen (HPN) layer, multiple layers of HPN and silicon dioxide ($SiO_2$), HPN and/or plasma enhanced chemical vapor deposition (PECVD) silicon nitride (SiN) on top. However, embodiments of the present invention are not limited by these examples, for example, any HPN can be used as the in-situ high quality dielectric, with any ex-situ, wet-etchable dielectric being used on the bottom without departing from the scope of the present invention.

In some embodiments of the present invention, HPN may refer to nearly stoichiometric $Si_3N_4$ having low impurity concentrations both in the $Si_3N_4$ and at the interface between the $Si_3N_4$ and the underlying layer. This may be achieved by depositing the HPN layer in the same reactor as the underlying layer and using the conditions described further herein.

As seen in FIG. 1E, a gate contact 32 is formed in the recess and contacts the exposed portion of the barrier layer 22. The gate contact may be a "T" gate as illustrated in FIG. 1E and may be fabricated using conventional fabrication techniques. Suitable gate materials may depend on the composition of the barrier layer, however, in certain embodiments, conventional materials capable of making a Schottky contact to a nitride based semiconductor material may be used, such as Ni, Pt, $NiSi_x$, Cu, Pd, Cr, W and/or WSiN.

Figure 1F:
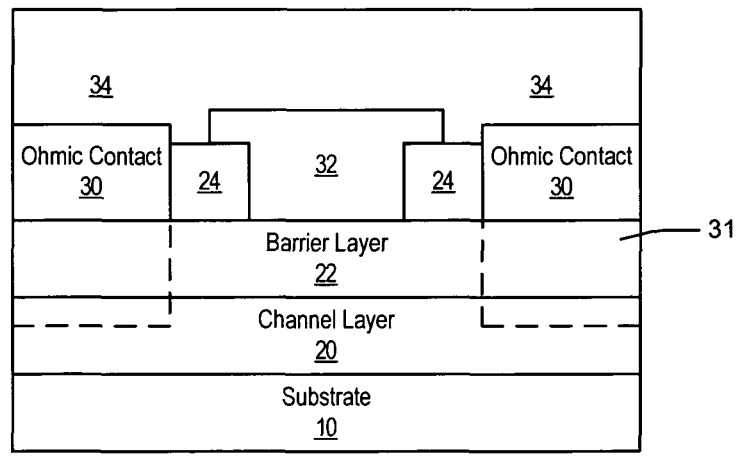

FIG. 1F illustrates the formation of a passivation layer 34. The passivation layer may be blanket deposited on the structure of FIG. 1E. In particular embodiments, the passivation layer 34 is deposited so as to substantially fill a gap between the protective layer 24 and the ohmic contacts 30 and also a gap between the protective layer 24 and the gate contact 32, if such gap(s) exist. In certain embodiments of the present invention, the passivation layer 34 may include, for example, silicon nitride, aluminum nitride, silicon dioxide and/or an oxynitride. Furthermore, the passivation layer 34 may be a single layer or multiple layers of uniform and/or non-uniform composition without departing from the scope of the present invention.

While embodiments of the present invention have been described herein with reference to particular HEMT structures, the present invention should not be construed as limited to such structures. For example, additional layers may be included in the HEMT device while still benefiting from the teachings of the present invention. Such additional layers may include GaN cap layers, as for example, described in Yu et al., "Schottky barrier engineering in III-V nitrides via the piezoelectric effect," Applied Physics Letters, Vol. 73, No. 13, 1998, or in U.S. Patent Publication No. 2002/0066908A1 for "ALUMINUM GALLIUM NITRIDE/GALLIUM NITRIDE HIGH ELECTRON MOBILITY TRANSISTORS HAVING A GATE CONTACT ON A GALLIUM NITRIDE BASED CAP SEGMENT AND METHODS OF FABRICATING SAME," the disclosures of which are incorporated herein by reference as if set forth fully herein. In some embodiments, insulating layers such as SiN, or relatively high quality AlN may be deposited for making a MISHEMT and/or passivating the surface. The additional layers may also include a compositionally graded transition layer or layers.

Furthermore, the barrier layer 22 may also be provided with multiple layers as described in United States Patent Publication No. 2002/0167023A1, to Smorchkova et al., entitled "GROUP-III NITRIDE BASED HIGH ELECTRON MOBILITY TRANSISTOR (HEMT) WITH BARRIER/ SPACER LAYER," the disclosure of which is incorporated herein by reference as if set forth fully herein. Thus, embodiments of the present invention should not be construed as limiting the barrier layer to a single layer but may include, for example, barrier layers having combinations of GaN, AlGaN and/or AlN layers. For example, a GaN, AlN structure may be utilized to reduce or prevent alloy scattering. Thus, embodiments of the present invention may include nitride based barrier layers, such nitride based barrier layers may include AlGaN based barrier layers, AlN based barrier layers and combinations thereof.

In the drawings and specification, there have been disclosed typical embodiments of the invention, and, although specific terms have been employed, they have been used in a generic and descriptive sense only and not for purposes of limitation.

That which is claimed is:

1. A method of forming a semiconductor device, the method comprising:
   providing a semiconductor layer;
   forming a mask on the semiconductor layer;
   implanting ions having a first conductivity type into the semiconductor layer according to the mask to form implanted regions on the semiconductor layer;
   forming metal layers on the implanted regions according to the mask; and
   annealing the implanted regions and the metal layers in a single step to respectively activate the implanted ions in the implanted regions and provide ohmic contacts on the implanted regions,
   wherein the semiconductor device comprises a Group III-nitride semiconductor device.

2. The method of claim 1:
   wherein providing the semiconductor layer comprises:
   forming a channel layer on the semiconductor substrate;
   forming a barrier layer on the channel layer; and
   forming a protective layer on the barrier layer; and
   wherein forming the mask comprises forming the mask on the protective layer.

3. The method of claim 2:
   wherein implanting ions is preceded by etching the protective layer according to the mask to expose at least a portion of a surface of the barrier layer; and
   wherein implanting ions further comprising implanting ions having the first conductivity type into the barrier layer according to the mask to form implanted regions on the barrier layer.

4. The method of claim 3, wherein the implanted regions extend at least partially into the channel layer.

5. The method of claim 2, wherein implanting ions comprises implanting ions having the first conductivity type into the protective layer and the barrier layer according to the mask to form implanted regions in the protective layer and the barrier layer, the method further comprising:
   etching the protective layer according to the mask to expose at least a portion of the implanted regions of the barrier layer.

6. The method of claim 5, wherein the implanted regions extend at least partially into the channel layer.

7. The method of claim 2, wherein the protective layer comprises a high purity nitrogen (HPN) layer.

8. The method of claim 7, wherein the HPN layer has a thickness of from about 50 to about 150 nm.

9. The method of claim 7, wherein the HPN layer comprises a layer of HPN having a thickness of from about 50 to about 150 nm and a silicon dioxide ($SiO_2$) layer on the HPN layer having a thickness of from about 100 to about 250 nm.

10. The method of claim 1, wherein the ohmic contacts include at least one refractory metal.

11. The method of claim 10, wherein the refractory metal includes Ti, TiW, Mo, Ta, W, WSi, Re, Nb, TiWN, NiSi and/or TiSi.

12. The method of claim 1, wherein the ohmic contacts are self-aligned to the implanted regions.

13. The method of claim 1, wherein the first conductivity type comprises an n-type conductivity.

14. The method of claim 13, wherein implanting ions comprising implanting silicon ions.

15. The method of claim 1, wherein annealing comprises annealing the implanted regions and the metal layer at a temperature of at least about 950° C.

16. A method of forming a Group III-nitride semiconductor device, the method comprising:
   providing a semiconductor layer;
   selectively implanting ions into the semiconductor layer to provide highly doped implanted regions in the semiconductor layer;
   forming a refractory metal layer on the highly doped implanted regions in the semiconductor layer, wherein the highly doped implanted regions and refractory metal layer are both formed using a single mask; and
   annealing the highly doped implanted regions and the refractory metal layer in a single step to respectively activate the implanted ions of the highly doped implanted regions and form ohmic contacts that are self-aligned to the implanted regions on the implanted regions,
   wherein providing the semiconductor layer comprises:
   forming a channel layer on the semiconductor substrate;
   forming a barrier layer on the channel layer; and
   forming a protective layer on the barrier layer.

17. The method of claim 16, further comprising forming a mask on the protective layer, wherein selectively implanting comprises selectively implanting ions into the semiconductor layer according to the mask and wherein forming a refractory metal layer further comprises forming a refractory metal layer on the highly doped implanted regions in the semiconductor layer according to the mask.

18. The method of claim 17:
   wherein selectively implanting ions is preceded by etching the protective layer according to the mask to expose at least a portion of a surface of the barrier layer; and
   wherein selectively implanting ions further comprises selectively implanting ions having the first conductivity type into the barrier layer according to the mask to form implanted regions on the barrier layer.

19. The method of claim 18, wherein the implanted regions extend at least partially into the channel layer.

20. The method of claim 17, wherein selectively implanting ions comprises selectively implanting ions having the first conductivity type into the protective layer and the barrier layer according to the mask to form implanted regions in the protective layer and the barrier layer, the method further comprising:
   etching the protective layer according to the mask to expose at least a portion of the implanted regions of the barrier layer.

21. The method of claim 20, wherein the implanted regions extend at least partially into the channel layer.

22. The method of claim 16, wherein the protective layer comprises a high purity nitrogen (HPN) layer.

23. The method of claim 22, wherein the HPN layer has a thickness of from about 50 to about 150 nm.

24. The method of claim 22, wherein the HPN layer comprises a layer of HPN having a thickness of from about 50 to about 150 nm and a silicon dioxide ($SiO_2$) layer on the HPN layer having a thickness of from about 100 to about 250 nm.

25. The method of claim 16, wherein the refractory metal includes Ti, TiW, Mo, Ta, W, WSi, Re, Nb, TiWN, NiSi and/or TiSi.

26. The method of claim 16, wherein the implanted ions comprise n-type conductivity ions.

27. The method of claim 26, wherein the n-type conductivity ions comprise silicon ions.

28. The method of claim 16, wherein annealing comprises annealing the implanted regions and the refractory metal layer at a temperature of at least about 950° C.

29. The method of claim 1:
wherein providing the semiconductor layer comprises forming a protective layer; and
wherein implanting the ions is preceded by etching the protective layer according to the mask.

30. A method of forming a semiconductor device, the method comprising:
providing a semiconductor layer;
providing a protective layer on the semiconductor layer;
providing a single mask on the protective layer;
etching the protective layer according to the mask;
implanting ions having a first conductivity type into the semiconductor layer according to the mask to form implanted regions on the semiconductor layer; and
providing metal layers on the implanted regions according to the mask.

31. The method of claim 30, further comprising annealing the implanted regions and the metal layers in a single step to respectively activate the implanted ions in the implanted regions and provide ohmic contacts on the implanted regions.

32. The method of claim 1, wherein the semiconductor device is a gallium nitride (GaN) semiconductor device.

33. The method of claim 32, wherein the GaN semiconductor device comprises a High Electron Mobility Transistor (HEMT).

* * * * *

UNITED STATES PATENT AND TRADEMARK OFFICE
CERTIFICATE OF CORRECTION

PATENT NO. : 9,040,398 B2  
APPLICATION NO. : 11/434853  
DATED : May 26, 2015  
INVENTOR(S) : Saxler et al.

Page 1 of 1

It is certified that error appears in the above-identified patent and that said Letters Patent is hereby corrected as shown below:

In the specification  
Column 6, Line 53: Delete "$0 \leq x \leq 1$," insert -- $0 \leq x < 1$, --

Signed and Sealed this  
Ninth Day of February, 2016

Michelle K. Lee  
*Director of the United States Patent and Trademark Office*